United States Patent [19]
Jansen et al.

[11] Patent Number: 5,496,583
[45] Date of Patent: Mar. 5, 1996

[54] HYDROGEN FLUORIDE DOPANT SOURCE IN THE PREPARATION OF CONDUCTIVE COATED SUBSTRATE

[75] Inventors: Kai W. Jansen; Benjamin F. Fieselmann, both of Newtown, Pa.

[73] Assignee: Amoco/Enron Solar, Frederick, Md.

[21] Appl. No.: 297,400

[22] Filed: Aug. 29, 1994

[51] Int. Cl.$^6$ .................... C23C 16/00; B05D 5/12
[52] U.S. Cl. .................. 427/109; 427/126.3; 427/248.1; 427/255; 427/255.1; 427/255.2; 65/60.5
[58] Field of Search .................. 427/109, 126.3, 427/248.1, 255, 255.1, 255.2; 65/60.5

[56] References Cited

U.S. PATENT DOCUMENTS

| | | | |
|---|---|---|---|
| 4,590,096 | 5/1986 | Lindner | 427/109 |
| 4,880,664 | 11/1989 | O'Dowd et al. | 427/109 |
| 5,102,721 | 4/1992 | O'Dowd et al. | 428/212 |
| 5,393,563 | 2/1995 | Ellis, Jr. | 427/248.1 |

Primary Examiner—Roy V. King
Attorney, Agent, or Firm—Thomas Tolpin

[57] ABSTRACT

The present invention relates to the production of hydrogen fluoride dopant source gases for use in the production of conductive coatings on a substrate. More specifically, a fluorocarbon source gas is decomposed in the presence of oxygen to yield HF which is passed to a deposition furnace wherein a fluoride doped metal oxide coated glass substrate is prepared.

10 Claims, 1 Drawing Sheet

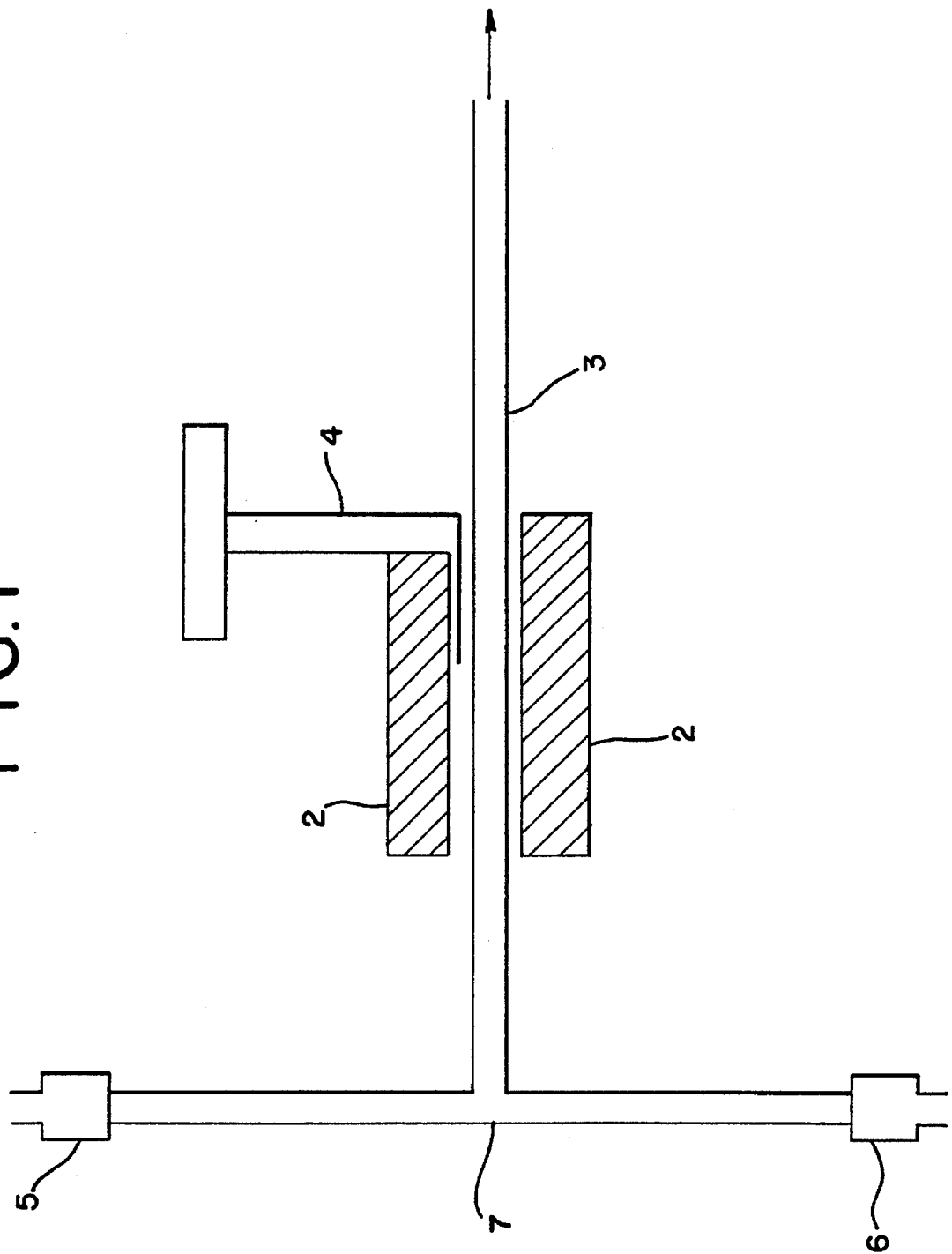

HYDROGEN FLUORIDE DOPANT SOURCE IN THE PREPARATION OF CONDUCTIVE COATED SUBSTRATE

BACKGROUND OF THE INVENTION

1. Field of the Invention

The present invention relates to a method for the preparation of a fluoride containing conductive coated substrate, e.g. glass.

The present invention further relates to the decomposition, e.g., by combustion, of fluorocarbon in the presence of an oxygen source to prepare hydrogen fluoride as a dopant source in the preparation of a conductive coated substrate, e.g. glass.

More particularly, the present invention relates to a method of forming a fluoride containing conductive metal oxide, e.g., tin oxide, coated substrate, e.g. glass.

2. Description of the Related Art

The preparation of transparent conducting coatings, e.g. TCOs (transparent conductive oxides) from sources such as tin, indium and zinc compounds in the presence of an oxygen source is well known. Methods of preparing conductive oxide coatings require the introduction of a coating source gas, e.g., tin, indium or zinc compounds, such as tin tetrachloride, tetramethyltin, trimethylindium or diethylzinc, o a coating furnace. The source gas is deposited in the presence of an oxygen source, such as $O_2$, water, alcohol and the like, which reacts with the source compound, thereby forming a coating of, for example, tin oxide, indium oxide or zinc oxide.

Often these coatings are doped with a fluoride component, e.g., HF, to improve their performance, e.g., conductivity. A multitude of fluoride sources have been used in the prior art methods of forming doped conductive coated glass.

Routinely, gas blends of hydrogen fluoride in pressurized cylinders, typically 0.5–1.5% hydrogen fluoride in nitrogen, are used, but have the drawbacks of being expensive, corrosive and toxic. Systems based on liquid hydrogen fluoride have been found to be more cost effective, but the problems of corrosion, particularly with flow controllers, and safety associated with storing and handling of a toxic compound (hydrogen fluoride has a boiling point of 19.5° C.) continue to plague the industry.

The prior art generally recognizes the ability to decompose chlorofluorocarbons, chlorohydrocarbons and fluorocarbons in the presence of oxygen by a combustion reaction and to thereby obtain as one of the by-products, a small amount of hydrogen fluoride. The prior art, however, has never recognized the concept of feeding such a combustion product stream into a furnace in the preparation of conductive coated substrates, e.g., glass products.

Some in the field have attempted the direct injection of fluorocarbons into a tin oxide coating furnace but under the temperature and flow conditions that are utilized in such furnaces, only a small amount, less than 1%, of most fluorocarbons are decomposed. The direct injection of fluorocarbons into the tin oxide coating furnace requires excessively large flows of reactant gas to get the necessary levels of dopant to result in sufficient fluoride doping and high conductivity. Because so little of the fluorocarbons are decomposed and because the release into the air of large amounts of fluorocarbons is undesirable in light of recent environmental concerns about the effect of chlorofluorocarbons in the atmosphere, this method has heretofore been unacceptable.

The present inventors have devised a simple and effective method for fluoride doping of transparent conductive coatings.

The inventors have further devised a cost effective and safe method of preparing high yields of fluoride source gas from fluorocarbons.

SUMMARY OF THE INVENTION

It is therefore an object of the present invention to overcome the foregoing and other difficulties encountered in the prior art.

A further object of the present invention is to provide a safe and efficient method of producing high yields of hydrogen fluoride source gas. More particularly, the present invention provides a method whereby inert fluorocarbon reactants are converted to HF dopant source gases immediately preceding their use, thereby overcoming the toxicity and corrosion problem of the prior art.

Another object of the present invention is to provide an improved method of preparing fluoride containing transparent conductive coatings on substrates.

These and other objects are accomplished by passing a mixture of a fluorocarbon and an excess of air into a reactor heated to above the decomposition temperature of the fluorocarbon. The hydrogen fluoride generated during the reaction and the excess air are passed directly into the deposition furnace and deposited with the conductive compound to give a coated substrate.

Additional apparent advantages of the invention will be set forth in part in the description which follows and in part will be apparent from the description, or may be learned by practice of the invention. The objects and advantages of the invention will be realized and attained by means of the elements and combinations particularly pointed out in the appended claims.

BRIEF DESCRIPTION OF THE DRAWINGS

FIG. 1 is an illustration of a fluorocarbon decomposition apparatus.

DESCRIPTION OF THE PREFERRED EMBODIMENTS

According to the present invention, the generation of hydrogen fluoride for use as a dopant in controlling the conductivity of oxides deposited on glass or any substrate is carried out by combining a fluorocarbon source with an oxygen source and heating the combination above the decomposition temperature of the fluorocarbon. The fluoride containing dopant feed gas, e.g. hydrogen fluoride, which is generated during the decomposition process can be passed directly into a deposition furnace and deposited with a conductive material onto a substrate.

The method of the present invention will work with any fluorocarbon source selected from any art recognized organofluoride compound. More particularly, the fluorocarbon is selected from trichlorofluoromethane, dichlorodifluoromethane, chlorotrifluoromethane, bromotrifluoromethane, carbontetrafluoride, dichlorofluoromethane, chlorodifluoromethane, trifluoromethane, chlorofluoromethane, methylenefluoride, methylfluoride, pentachlorofluoroethane, tetrachlorodifluoroethane, trichlorotrifluoroethane, dichlorotetrafluoroethane, dibromotetrafluoroethane, chloropentafluoroethane, hexafluoroethane, dichlorotrifluoroethane, chlorotetrafluoroethane, pentafluoroethane, chlorotrifluoroethane, chlorodifluoroethane, trifluoroethane, difluoroethane, octafluoropropane, hexafluoropropylene, dichlorohexafluorocyclobutane, chloroheptafluorocyclobutane, octafluorocyclobutane, dichlorodifluoroethylene, chlorotrifluoroethylene, tetrafluoroethylene, vinylidene fluoride, vinylfluoride, mixtures thereof and the like. Hydrogen containing fluorocarbons are preferred but if insufficient hydrogen is present, a hydrogen source gas, for example water, can also be added. Any oxygen source gas may be used for example, air, pure oxygen and the like.

In one preferred embodiment, the fluorocarbon source gas is decomposed according to the formula set forth below:

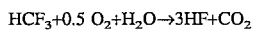

Preferred fluorocarbon compounds for use herein include 1,1-difluoroethylene, chlorodifluoromethane and trifluoromethane or fluoroform, halocarbons 1132a, 22, and 23, respectively or halocarbon 152a, 1,1-difluoroethane. Most preferred is halocarbon 1132a, 1,1-difluoroethylene, as it only requires the introduction of a source of oxygen, i.e., the number of hydrogen equals the number of fluorine in the compound. The decomposition of halocarbon 1132a is according to the following balanced equation:

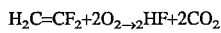

The presence of double bonds increases the chemical reactivity of carbon containing compounds including halocarbons. The carbon-carbon double bond in 1,1-difluoroethylene make it a more desirable compound to crack compared to compounds such as its saturated analogue 1,1-difluoroethane ($HF_2C\text{-}CH_3$). 1,1-Difluoroethylene and 1-fluoroethylene are the most preferred compounds to crack in the presence of oxygen in accordance with the present invention.

Once an appropriate mixture of reactant gases is selected, these materials are fed to a combustion furnace. In a preferred embodiment of the present invention, this furnace is a tube furnace.

In the process for the present invention, the reaction temperature is controlled by the combustion furnace. The combustion furnace is set to a temperature in excess of the fluorocarbon's autoignition or autodecomposition temperature. The temperature of the components is then raised to heat the mixture to a temperature sufficient to cause decomposition of the fluorocarbon. This temperature varies with the fluorocarbon used; typically the temperature of the furnace is from 500° to 750° C., although it may be higher, more preferably from about 600° to about 700° C. For one preferred fluorocarbon 1,1-difluoroethylene the appropriate temperature is from 600°-650° C., most preferably 640° C.

A fluorocarbon to oxidation source gas ratio of from 1/2:1 to about 1:100, or greater can be used. The ratio is more preferably greater than about 1:50. The high percentage of oxygen source gas ensures complete decomposition of the fluorocarbon while at the same time keeps the concentration of the fluorocarbon well below its lower explosive limit. The reaction is preferably carried out using a concentration of fluorocarbon source of less than about 5%, when using a combustion furnace which is not equipped to handle explosive gaseous mixtures. Concentrations of greater than 5% can be used provided sufficient oxygen for complete decomposition is present and the reactor is designed to safely handle potentially explosive gaseous mixtures.

The residence time of the fluorocarbon/oxygen source mixture is from about 10 to 100 seconds. Residence times of less than 30 seconds are most preferred.

This method of producing HF can be used in any process wherein a small amount of HF is required. These processes may include but are not limited to doping processes and etching processes.

One preferred apparatus used to decompose fluorocarbons is shown in FIG. 1. In this preferred embodiment, a one inch by twelve inch tube furnace A is used to heat an empty one inch diameter stainless steel tube B. The reaction temperature can be monitored and controlled using a thermocouple C attached to the stainless steel tube B. Air and an appropriate fluorocarbon can be mixed through flow controllers D and E, and sent through tube F into the heated tube B. The product gases which are expelled from the heated tube B can then be sent either to the deposition furnace or to an analyzer.

The product streams can be analyzed for hydrogen fluoride by passing the gas into a glass pipette and then into a bubbler filled with a known amount of aqueous sodium hydroxide solution and phenolphthalein indicator. The rate of HF production can be calculated by using a stopwatch to determine the time required for the phenolphthalein color to turn from pink to clear. The percent conversion of the fluorocarbon to hydrogen fluoride can be calculated from the known initial flow of fluorocarbon and the determined rate of HF production.

The process of the present invention can further use a catalyst to aid in the decomposition of the fluorocarbon source. Appropriate catalytic materials can be selected by one skilled in the art depending upon the fluorocarbon source gas which is selected.

Once the fluorocarbon has been decomposed, the gas mixture can be passed into a deposition furnace for the production of fluoride doped transparent conductive coatings. The substrate upon which the coating is to be deposited can be selected by the skilled artisan based upon the desired end product. According to the present invention glass is a preferred substrate in the production of photovoltaic devices and other electronic devices.

Preferred sources for the production of the conductive coating include tin, indium and zinc compounds. These are reacted with an oxygen source such as water and deposited in the form of tin oxide, indium oxide and zinc oxide which in the presence of an HF fluoride source contain a fluoride dopant. In one preferred embodiment of the present invention, fluoride doped tin oxide is coated onto a glass substrate.

Methods for preparing the coatings according to the present invention can include any coating method which requires the use of a fluoride dopant feed gas stream. Coatings prepared with the method according to the present invention have a resistance on the order of 3 to 50 ohm/square.

Methods of preparing conductive oxide coatings require the introduction of a coating source gas, e.g., a tin, indium or zinc compound, to a coating furnace. The source gas is deposited in the presence of an appropriate oxygen source (water, alcohol, oxygen and the like) which serves to react with the source material, thereby forming a coating of, for example, tin oxide, indium oxide or zinc oxide. The coating furnace is maintained at an appropriate temperature, for example 400° to 650° C.

Standard methods of forming tin oxide coatings are described for example in U.S. Pat. No. 4,880,664 to O'Dowd et al. all of which is herein incorporated by reference.

One preferred method of forming tin oxide involves heating glass substrates to the deposition temperature, approximately 400° to 650° C., on a conveyor belt passing through a furnace at atmospheric pressure. The deposition areas contains nitrogen curtains to exclude outside air from interfering with the reaction and an injector head through which the vaporized reactants are introduced. The reactants include tin tetrachloride, water, hydrogen fluoride, which according to the present invention has been formed from the decomposition of fluorocarbon, and optionally methanol depending on the specific morphology and coating characteristic desired. The substrate passes under the injector head in a continuous fashion as a tin oxide film is deposited.

Typical flow rates for a tin oxide film deposited on a 71 cm by 91 cm by 3 mm glass substrate are as follows:

Belt speed 46 cm/min

Deposition Temperature 540° C.

| Reactant | Molar Flow (moles × $10^2$/min) |
|---|---|
| $SnCl_4$ | 3.9 |
| $H_2O$ | 33.3 |
| $CH_3OH$ | 4.3 |
| $C_2H_2F_2$ | 0.22 |
| Air | 22.0 |

The above parameters resulted in a tin oxide coating which was approximately 540 nm thick with a sheet resistance of 6.6 ohm per square.

The following examples are illustrative of the invention embodied herein and are not to be considered limiting.

Examples

In Examples 1–14 the decomposition parameters were studied to optimize HF production from halocarbon 1132a ($F_2C=CH_2$). A temperature range from 400° to 650° C. was investigated. Fluorocarbon to air ratios of 1 part halocarbon to 7–120 parts oxidizer were studied. Most fluorocarbons are nonflammable, but for those that are flammable, such as halocarbon 1132a, it was important to make fluorocarbon to air ratios which were out of the explosive range.

Example 1

A mixture of halocarbon 22 ($CHClF_2$) at 9 sccm/min and air at 600 sccm/min were introduced to a hydrocarbon cracking furnace as shown in FIG. 1. The mixture was retained in the apparatus for a period of 10 seconds at a temperature of about 600° C. The outlet materials were analyzed and a 26.8% conversion to HF was determined. The percent conversion was calculated as the amount of HF measured, divided by the amount of HF possible if complete conversion occurred. A gas chromatographic/mass spectral analysis of the gases exiting the furnace showed that all of the halocarbon fed into the furnace was either decomposed to HF or retained in the combustion furnace. The loss of fluorocarbons to the atmosphere by partial combustion is not a factor in the present invention and thus, does not raise any concerns about the environmental effects of releasing chlorofluorocarbons into the environment. The results can be found in Table 1, below.

Examples 2–14

These examples were carried out as in Example 1 above. The processing parameters and results are set forth in Table 1, below.

TABLE 1

SAMPLE DATA SHOWING THE DECOMPOSITION OF FLUOROCARBONS TO PRODUCE HYDROGEN FLUORIDE

| Fluorocarbon | Temperature °C. | Halocarbon Flow (sccm/min) | Air Flow (sccm/min) | Residence Time (sec.) | Conversion (%) |
|---|---|---|---|---|---|
| Halocarbon 22 | 600 | 9 | 600 | 10 | 26.8 |
| Halocarbon 23 | 600 | 9 | 600 | 10 | 18.9 |
| Halocarbon 1132a | 400 | 9 | 600 | 10 | 4.2 |
| Halocarbon 1132a | 500 | 9 | 600 | 10 | 25.4 |
| Halocarbon 1132a | 550 | 9 | 600 | 10 | 40.2 |
| Halocarbon 1132a | 600 | 9 | 600 | 10 | 64.5 |
| Halocarbon 1132a | 650 | 9 | 600 | 10 | 73.9 |
| Halocarbon 1132a | 650 | 7 | 500 | 12 | 82.8 |
| Halocarbon 1132a | 650 | 7 | 250 | 24 | 59.0 |
| Halocarbon 1132a | 650 | 7 | 600 | 10 | 77.6 |
| Halocarbon 1132a | 650 | 2.5 | 150 | 40 | 26.5 |
| Halocarbon 1132a | 650 | 2.5 | 217 | 28 | 34.0 |
| Halocarbon 1132a | 650 | 2.5 | 300 | 20 | 42.2 |
| Halocarbon 1132a | 650 | 2.5 | 414 | 14 | 42.2 |

In Examples 15–29, the effects of flow rate on the percent decomposition of 1,1-difluoroethylene were studied.

Example 15

A mixture of 1,1-difluoroethylene at 2.5 sccm/min and air at 150 sccm/min were introduced to a hydrocarbon cracking furnace as shown in FIG. 1. The mixture was retained in the apparatus at a temperature of about 650° C. The outlet materials were analyzed and a 29.4% conversion to HF was determined. The percent conversion was calculated as the amount of HF measured, divided by the amount of HF possible if complete conversion occurred. A gas chromatographic/mass spectral analysis of the gases exiting the furnace showed that all of the halocarbon fed into the furnace-was either decomposed to HF or retained in the combustion furnace. The results can be found in Table 2, below.

Example 16–29

These examples were carried out in accordance with the description given for example 15. All examples were carried out with 1,1-difluoroethylene at a temperature of 650° C. The remainder of the processing parameters and results are set forth in Table 2, below.

TABLE 2

CONVERSION RESULTS FOR THE DECOMPOSITION OF
1,1-DIFLUOROETHYLENE AT 650° C. WITH AIR

| AIR FLOW (CC/MIN) | HALOCARBON FLOW % (CC/MIN) | HALOCARBON DECOMPOSITION TO HF |
|---|---|---|
| 150 | 2.5 | 29.4% |
| 150 | 2.5 | 26.5% |
| 150 | 2.5 | 26.1% |
| 217 | 2.5 | 34.0% |
| 217 | 2.5 | 31.0% |
| 217 | 2.5 | 37.9% |
| 300 | 2.5 | 45.6% |
| 300 | 2.5 | 40.4% |
| 300 | 2.5 | 42.2% |
| 414 | 2.5 | 20.8% |
| 414 | 2.5 | 21.9% |
| 291 | 2.5 | 44.5% |
| 291 | 2.5 | 39.5% |
| 291 | 2.5 | 38.4% |
| 291 | 2.5 | 36.9% |

Examples 30 and 31

These tests demonstrate the effectiveness of 1,1-Difluoroethylene and 1,1-Difluoroethane as dopants for tin oxide films when using the apparatus described in FIG. 1. Tin oxide coatings were prepared on glass using the following process at a deposition temperature of 540° C:

| Reactant | Molar Flow (moles × 102/min) |
|---|---|
| $SnCl_4$ | 3.9 |
| $H_2O$ | 33.3 |
| $CH_3OH$ | 4.3 |

In addition to the above, the fluorocarbon was mixed with 0.22 mole/min air and decomposed in the apparatus shown in FIG. 1 at a temperature of 650° C. The products of this decomposition were sent to the deposition chamber with the above reactants. The results for the two separate tests are as follows:

| Halocarbon | Molar Flow moles × ($10^2$/min) | Tin Oxide Film Thickness (nm) | Sheet Resistance (ohm/square) |
|---|---|---|---|
| 1,1-Difluoroethylene | 0.22 | 540 | 6.6 |
| 1,1-Difluororethane | 0.022 | 410 | 17 |

Other embodiments of the invention will be apparent to those skilled in the art from consideration of the specification and practice of the invention disclosed herein. It is intended that the specification examples be considered exemplary only, with the true scope and spirit of the invention being indicated by the following claims.

We claim:

1. A process for the preparation of a substrate having a fluoride doped conductive coating thereon comprising:

producing an HF dopant feed gas by heating a fluorocarbon in the presence of a source of oxygen to a temperature sufficient to decompose said fluorocarbon;

introducing said HF dopant feed gas into a conductive coating source gas; and depositing the coating from said HF dopant feed gas and said source gas on said substrate.

2. The process of claim 1, wherein the conductive coating is selected from the group consisting of tin oxide, zinc oxide and indium oxide.

3. The process of claim 1, wherein the fluorocarbon is selected from the group consisting of trichlorofluoromethane, dichlorodifluoromethane, chlorotrifluoromethane, bromotrifluoromethane, carbontetrafluoride, dichlorofluoromethane, chlorodifluoromethane, trifluoromethane, chlorofluoromethane, methylenefluoride, methylfluoride, pentachlorofluoroethane, tetrachlorodifluoroethane, trichlorotrifluoroethane, dichlorotetrafluoroethane, dibromotetrafluoroethane, chloropentafluoroethane, hexafluoroethane, dichlorotrifluoroethane, chlorotetrafluoroethane, pentafluoroethane, chlorotrifluoroethane, chlorodifluoroethane, trifluoroethane, difluoroethane, octafluoropropane, hexafluoropropylene, dichlorohexafluorocyclobutane, chloroheptafluorocyclobutane, octafluorocyclobutane, dichlorodifluoroethylene, chlorotrifluoroethylene, tetrafluoroethylene, vinylidene fluoride, vinylfluoride and mixtures thereof.

4. The process of claim 3, wherein the fluorocarbon is selected from $CHClF_2$, $CHF_3$ and $F_2C=CH_2$.

5. The process of claim 3, wherein the production of said HF dopant feed gas is carried out in the presence of a source of hydrogen.

6. The process of claim 5, wherein the source of hydrogen is water.

7. The process of claim 1, wherein the fluorocarbon and the oxygen source are heated to a temperature from about 500° to about 750° C.

8. The process of claim 1, wherein said source of oxygen is selected from oxygen gas and air.

9. A process for the preparation of a coated conductive substrate comprising:

producing an HF dopant feed gas by heating a fluorocarbon in the presence of a source of oxygen to a temperature sufficient to decompose said fluorocarbon and form the HF;

introducing said HF dopant feed gas and a source gas for producing a conductive coating to a deposition furnace containing said substrate; and depositing a fluoride doped conductive coating on said substrate.

10. A process for the preparation of tin oxide coated conductive glass comprising:

producing an HF dopant feed gas by heating a fluorocarbon in the presence of air to a temperature sufficient to decompose said fluorocarbon to form the HF;

introducing said HF dopant feed gas and a tin source gas to a deposition furnace containing a glass substrate; and depositing a fluoride doped tin oxide coating on said glass substrate.

* * * * *